US005239299A

United States Patent [19]
Apple et al.

[11] Patent Number: 5,239,299
[45] Date of Patent: Aug. 24, 1993

[54] DIGITAL EQUALIZATION OF TIME INTERLEAVED ANALOG TO DIGITAL CONVERTERS

[75] Inventors: G. Gordon Apple; James G. Harrison, both of Redondo Beach, Calif.

[73] Assignee: TRW Inc., Redondo Beach, Calif.

[21] Appl. No.: 740,746

[22] Filed: Aug. 6, 1991

[51] Int. Cl.⁵ ............................ H03M 1/06; H03M 1/12
[52] U.S. Cl. ....................................... 341/118; 341/141; 341/155
[58] Field of Search ............... 341/118, 141, 155, 110, 341/126

[56] References Cited

U.S. PATENT DOCUMENTS 4,633,226 12/1986 Black, Jr. .......................... 341/159
4,968,988 11/1990 Miki et al. ........................ 341/141

Primary Examiner—Sharon D. Logan
Attorney, Agent, or Firm—G. Gregory Schivley; Ronald L. Taylor

[57] ABSTRACT

An equalization method is provided for compensating for variations in the characteristics of individual analog-to-digital converters found in a time interleaved analog-to-digital converter circuit. One of a plurality of converters is chosen as a reference converter. Individual characteristics of the remaining converters are compared with the reference converter to provide differential responses therewith. The differential responses are equalized to provide compensation for variations in gain, offset, phase/frequency response, and timing found amongst the plurality of time interleaved converters.

17 Claims, 5 Drawing Sheets

DIGITAL EQUALIZATION OF TIME INTERLEAVED ANALOG TO DIGITAL CONVERTERS

This invention was made with Government support under Contract No. DASG-60-85-C-0092 awarded by the Department of the Army. The Government has certain rights in this invention.

BACKGROUND OF THE INVENTION

1. Field of the Invention

This invention relates to high speed analog-to-digital converters for converting an analog input signal to a plurality of digital signals and, more particularly, to digital equalization of an analog-to-digital converter configuration which employs a plurality of time interleaved analog-to-digital converters.

2. Discussion

Analog-to-digital converters are used in a wide variety of applications for converting an analog signal to a plurality of digital signals. Implementation of high speed analog-to-digital conversion may require that several individual analog-to-digital converters be time interleaved in order to obtain the necessary speed. The resulting configuration is a plurality of analog-to-digital converters, each being coupled in parallel with one another and timed sequentially. Given N number of converters, the resulting conversion is about N times the speed of a single converter.

Generally, such analog-to-digital converter configurations result in a greater distortion of the digital signals than if a single high speed analog-to-digital converter is used. This distortion results from variations in the characteristics amongst the individual time interleaved analog-to-digital converters. Typically, Such variations include differences in gain, offset, timing, frequency/phase response, non-linearity and non-monotonicity. Even if the individual converters initially have identical characteristics, these characteristics generally change with temperature, time, radiation, and power supply variations, amongst other possible causes.

It is therefore desirable to obtain a time interleaved analog-to-digital converter configuration that provides a response which essentially is equivalent to an ideal single high speed converter. In particular, it is desirable to obtain a time interleaved analog-to-digital converter configuration that eliminates individual variations of converter characteristics found amongst the plurality of analog-to-digital converters.

SUMMARY OF THE INVENTION

According to the teachings of the present invention, a digital equalization method is provided for removing variations in the characteristics of individual analog-to-digital converters found in a time interleaved analog-to-digital converter circuit. This equalization method compensates for the differences in converter offsets and variations of gain, timing, and frequency/phase response found amongst the individual analog-to-digital converters.

In accordance with the teachings of the present invention, a time interleaved analog-to-digital converter circuit is made up of a plurality of analog-to-digital converters that are sequentially timed to sample and convert an analog input signal to digital sample outputs. One of the converters is chosen as a reference. The frequency response of the reference is then subtracted from the remaining converters to obtain the differences amongst converters. The Z-transform of the differential responses are then placed in a matrix. This matrix of polynomials in the Z-domain is inverted to generate the coefficient for an equalization filter. Offset and gain equalization is provided by individual summers and multipliers.

Each individual analog-to-digital converter samples at a rate lower than the nyquist rate of the signal of interest. As a result, a simple equalization filter after each analog-to-digital converter would suffer from aliasing components. As such, it would not equalize over the full bandwidth of the signal. Therefore, an equalization filter is provided after each analog-to-digital converter, which receives input signals from the remaining analog-to-digital converters. Therefore, the filters need only operate at the sampling rate of the individual analog-to-digital converters and not at the total sampling rate of the system.

BRIEF DESCRIPTION OF THE DRAWINGS

The various advantages of the present invention will become apparent to those skilled in the art by reading the following specifications and by reference to the drawings in which.

DETAILED DESCRIPTION OF THE PREFERRED EMBODIMENT

Figure 1:
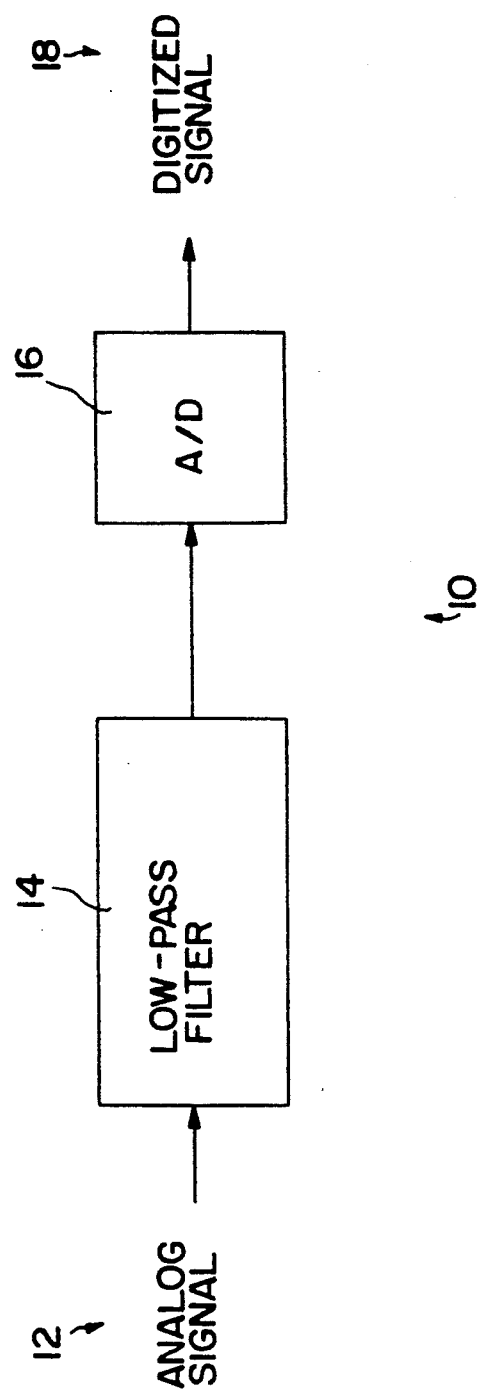
FIG. 1 is a block diagram which illustrates an ideal high speed analog-to-digital converter.

Turning now to FIG. 1, a block diagram for an ideal high speed single analog-to-digital converter configuration 10 is illustrated therein. A low pass filter 14 is coupled to a single high speed analog-to-digital converter 16. The low pass filter 14 filters out undesirable high frequency signals which might otherwise fold back into the nyquist range of the converter. The analog-to-digital converter 16 samples an input analog signal 12 and generates a plurality of digital signals 18. However, such converters are limited in conversion speed due to physical limitations of the devices employed.

Figure 2:
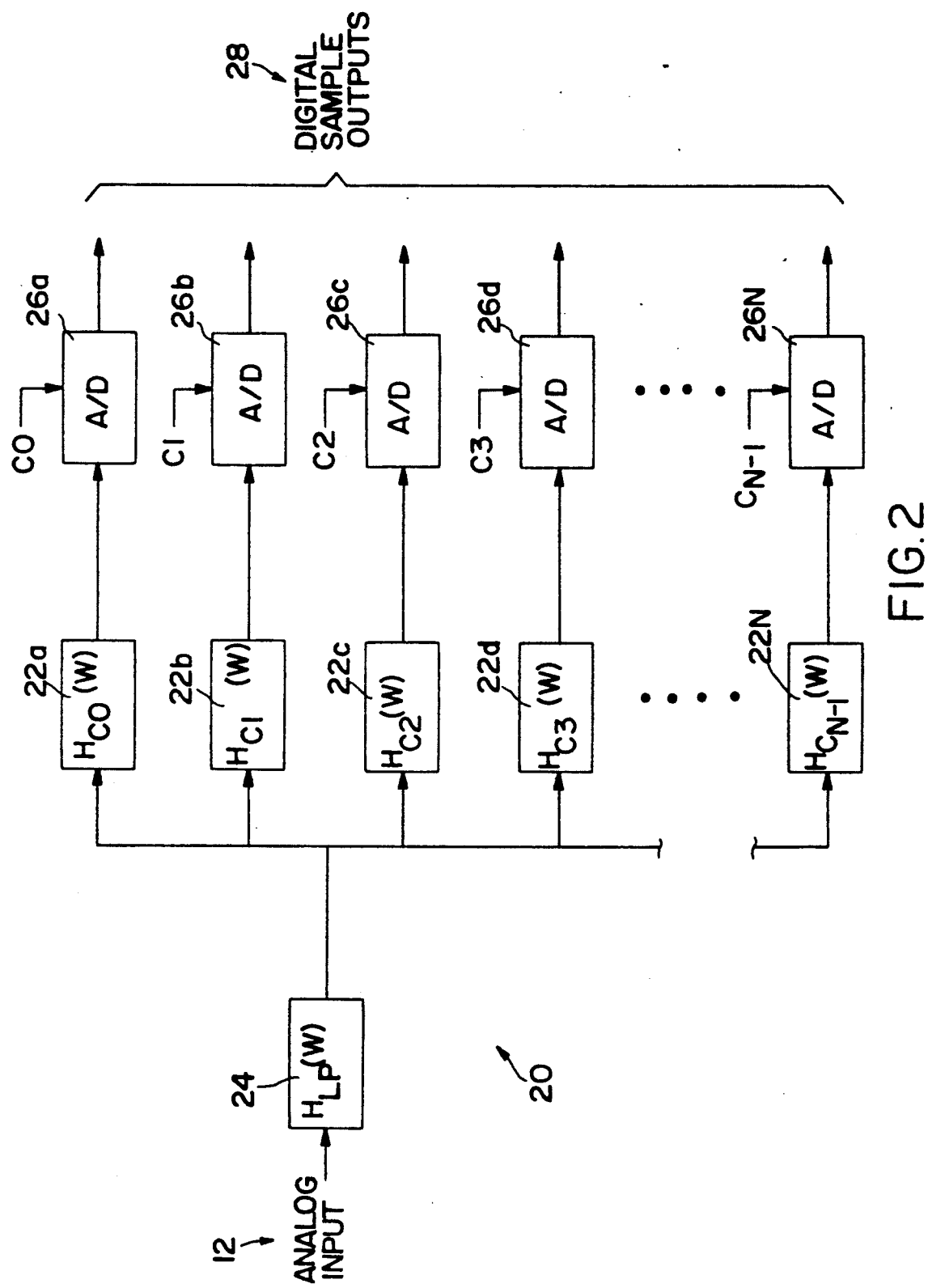
FIG. 2 is a block diagram illustrating a configuration of time interleaved analog-to-digital converters.

To increase the sampling speed of an analog-to-digital conversion, it may be necessary to time interleave a plurality of analog-to-digital converters as shown in FIG. 2. The resulting time interleaved analog-to-digital converter configuration 10 includes N number of sequentially timed analog-to-digital converters $26a-26n$ connected in parallel. Further, connected to the input of each of the analog-to-digital converter $26a-26n$ are filter models $22a-22n$ which model the phase and frequency characteristics of each of analog-to-digital converters $26a-26n$. A common low pass filter 24 is further provided for filtering out undesirable high frequency signals. As such, the analog signal 12 is sampled and digitized at a rate n times faster than a single analog-to-digital converter. Ideally, this configuration provides for a much faster high speed analog-to-digital conversion.

However, individual variations amongst the converter characteristics may occur due to changes occurring over time such as temperature, radiation, other environmental conditions and due to manufacturing variations among the analog circuitry components, amongst other causes. As such, these variations cause the converted digital output 28 to be distorted to a greater degree than that produced by a single high speed analog-to-digital converter.

Figure 3:
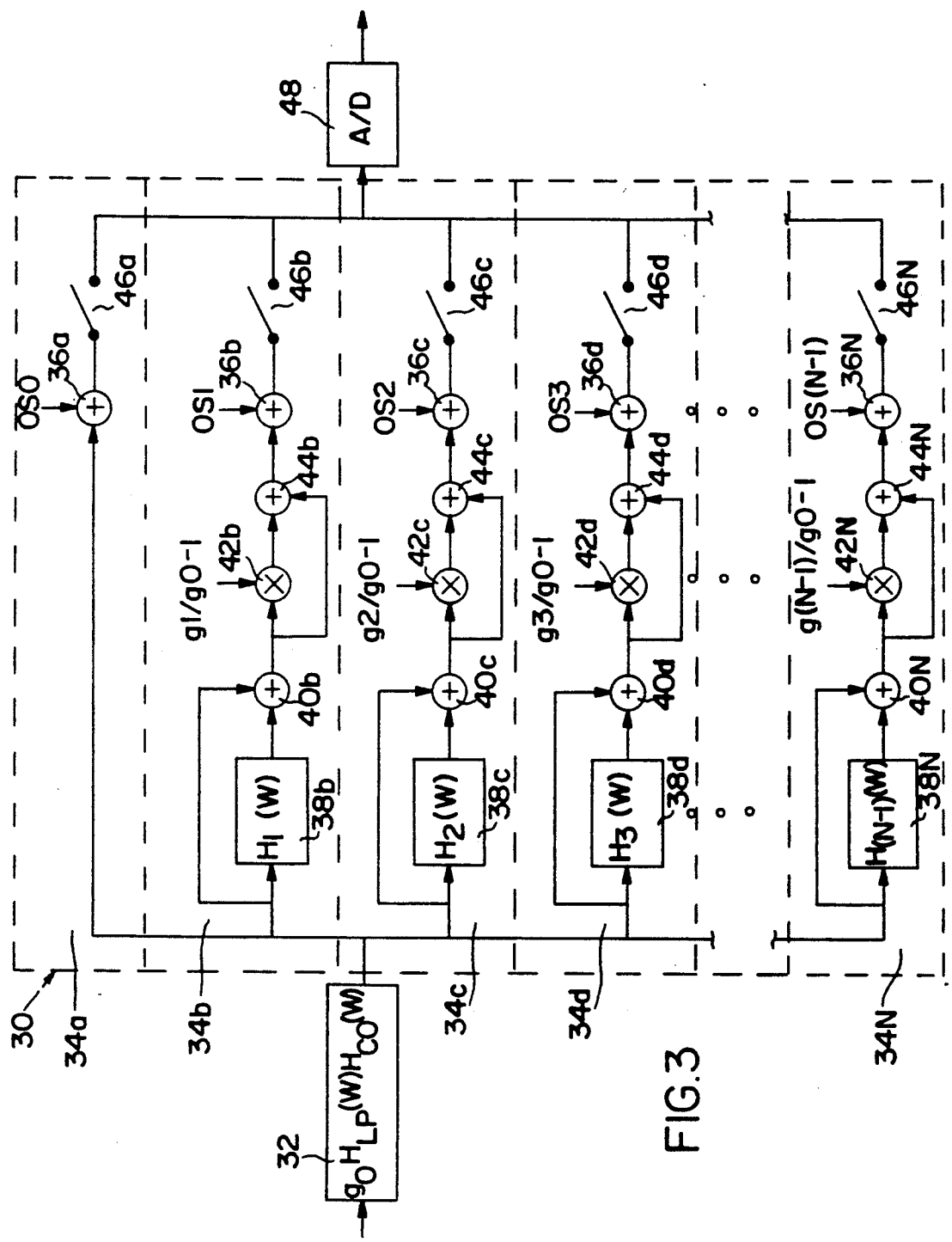
FIG. 3 is a block diagram which illustrates an equivalent model of the time interleaved analog-to-digital converters.

FIG. 3 illustrates an equivalent model of a plurality of time interleaved analog-to-digital converters. Here, the analog-to-digital converters are represented as ideal conversions of sequential samples. Individual offsets are indicated by OS0 through OS(N-1) and summers 36a through 36n. One of the plurality of converters is chosen as a reference. The overall gain and frequency response of the reference converter is that of the common filter element 32 preceding the plurality of analog-to-digital converters. The characteristics of the remaining converters are measured in comparison with the reference converter. This provides differential responses which are utilized in the correction process. Individual gains and frequency responses are represented as differential variations from the ideal and are referenced to the reference converter. The individual frequency variations are what is to be removed by digital filtering.

The equivalent model shown in FIG. 3 illustrates a plurality of branches 34a through 34n connected in parallel and being coupled between a common filter 32 on the input side and an equivalent analog-to-digital converter 48 on the output side. Branch 34a is chosen as the branch for the reference converter. The gain and frequency response of the reference converter are used as the reference responses.

Branches 34b through 34n are accordingly referenced to the reference converter. That is, each branch represents the variations in gain, offset, timing, and frequency/phase response with respect to the reference converter. Each branch models the individual offsets OS1 through OS(N-1) provided by summers 36b through 36n. Variations in gain are modeled by multiplying the individual branches by the gain ratio of the corresponding converter to the reference converter. In order to minimize error, the gain compensation will utilize the gain ratio as shown, for example, by g1/g2−1 on branch 34b, which is multiplied by multiplier 42b and added to the converter signal by summer 44b.

Frequency/phase response and timing variations are modeled by passive filters 38b through 38n. Switches 46a through 46n illustrate the sequential timing of the plurality of converters.

The individual analog-to-digital converters are assumed to be closely matched in their characteristics. The frequency and gain variations are assumed to be low level compared to the ideal response paths. Therefore, any correction filter should also involve low level response and should not significantly degrade the ideal signal path. Any distortions in the correction process should be low level relative to the already low level corrections and therefore are second order relative to the ideal signal path. This is the reason for handling the correction process with differential responses rather than dealing with absolute responses directly.

In operation, one analog-to-digital converter is chosen as a reference. The remaining analog-to-digital converter's individual characteristics are measured with respect to those of the reference converter to determine if variations are found and compensation is needed. The differential variations amongst the analog-to-digital converter responses are transformed to the Z domain and placed in a matrix. The matrix of polynomials in the Z domain are then inverted to generate the coefficients for an equalization filter. The overall analog-to-digital responses are equalized using conventional methods which can be implemented in either hardware or software. Additionally, the offset and differential gain are equalized with the use of summers and multipliers, which may be implemented with either hardware or software. Furthermore, the response of each individual analog-to-digital converter is measured by conventional methods and the coefficients for the equalization filter are adjusted in accordance with such measurements to thereby update for any changes that occur to the individual analog-to-digital converters.

Figure 4:
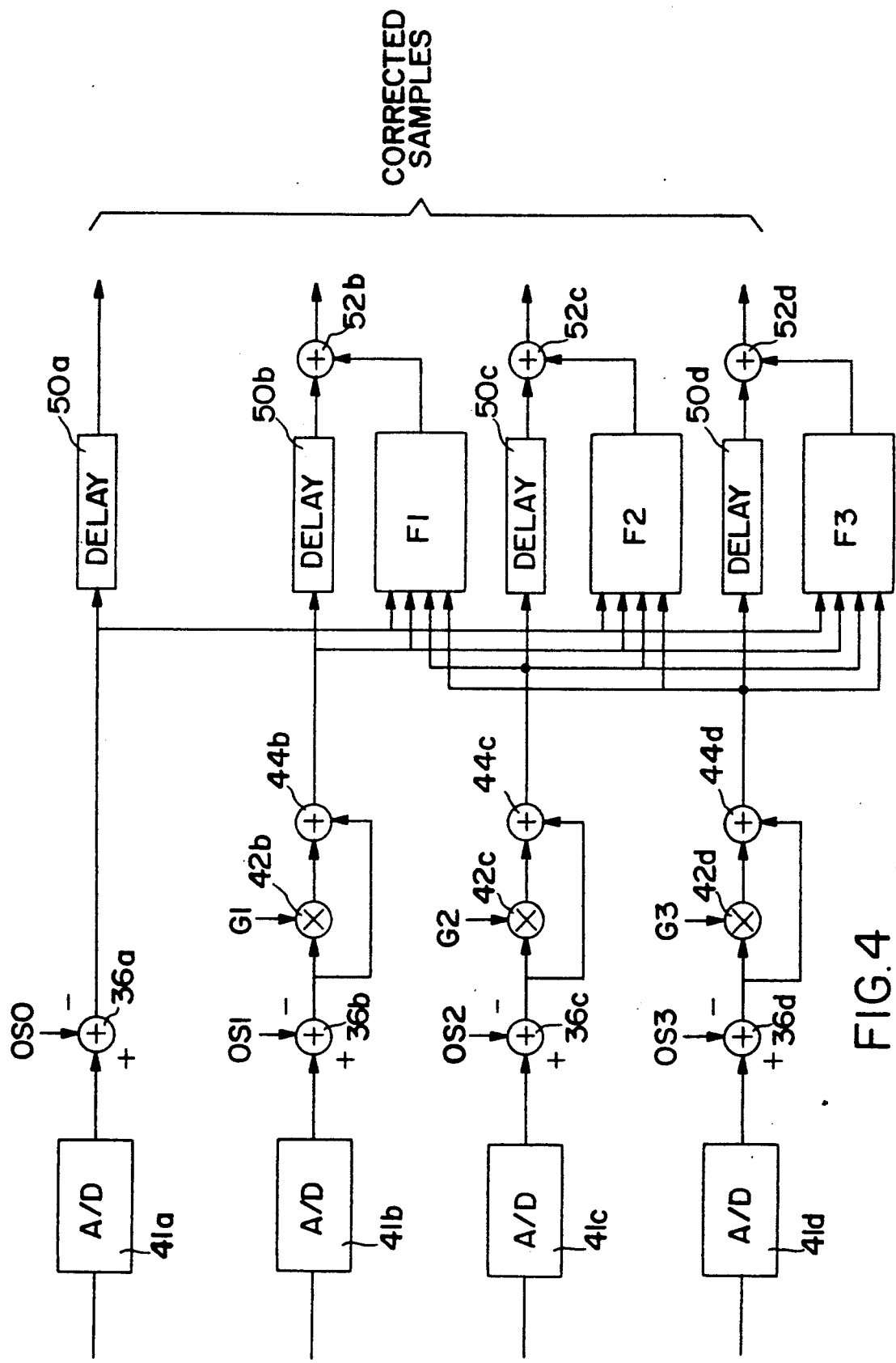
FIG. 4 is a block diagram which illustrates a digital equalizer.

FIG. 4 illustrates the implementation of an inverse filter for four interleaved analog-to-digital converters 41a–41d. First, the offsets OS0 through OS3 are removed and the individual gains G1 through G3 are equalized. Since the gains are assumed to be close, higher precision is obtained by using the multipliers 42b–44d to multiply the gain error by the signals and adding this correction term to the signals with summers 44b–44d as previously mentioned. Filters F1, F2 and F3 perform the digital filtering, while the delays 50a through 50d are provided to allow for time delays sufficient to compensate for the time required for the operation of filters F1, F2 and F3.

Figure 5:
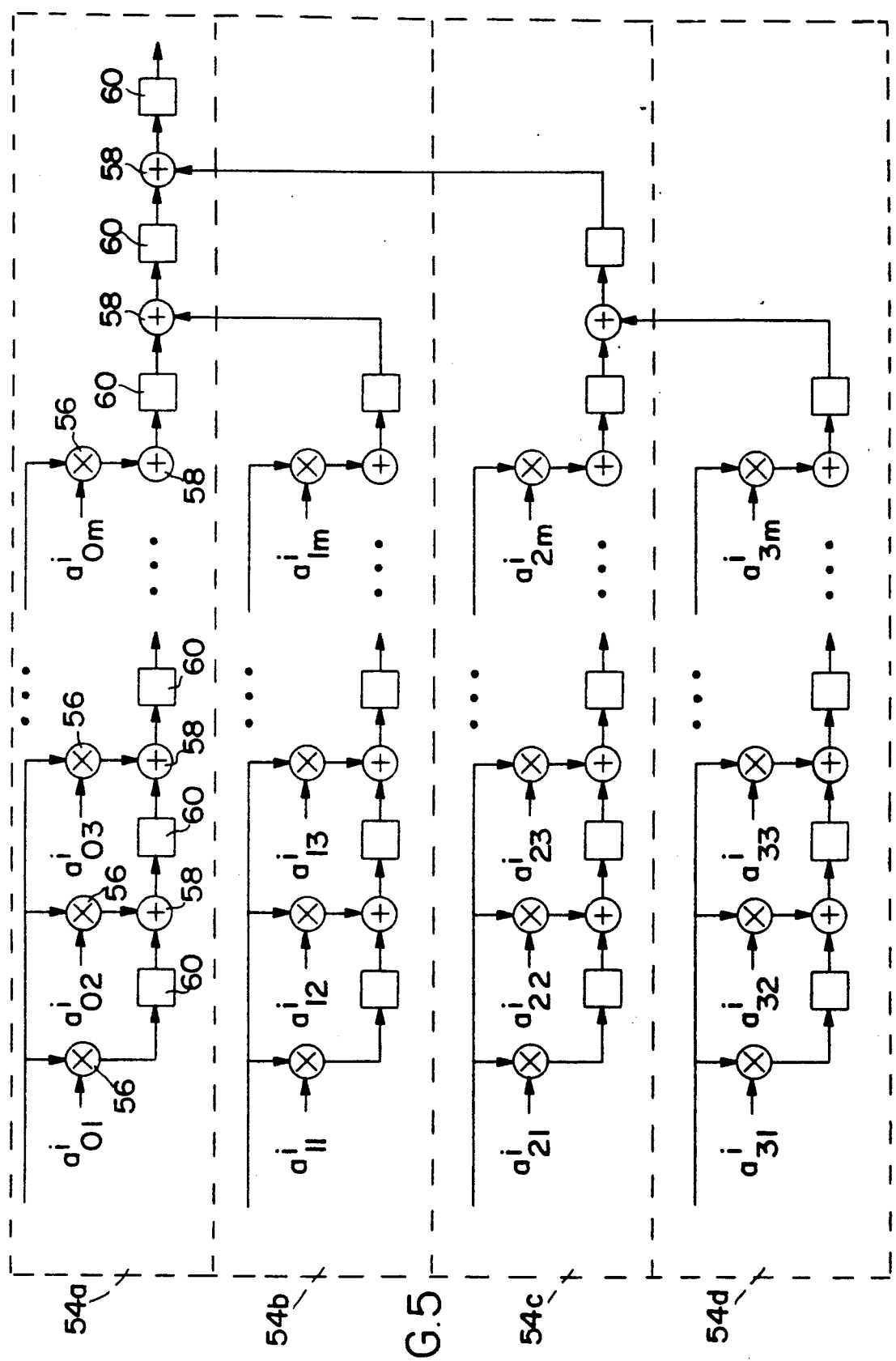
FIG. 5 is a block diagram which illustrates an individual equalization filter.

Filters F1, F2 and F3 are shown in detail in FIG. 5. Each filter illustrates a hardware assembly made up of a plurality of multipliers 56 and summers 58. The plurality of fixed delays 60 are provided to allow a causal implementation of filter factors which may be non-causal. Each of rails 54a through 54d forms the corresponding element of the correction matrix.

Periodically, the response of each individual analog-to-digital converter will be measured using digitally generated sine waves correlated with the samples of a sine wave from the analog-to-digital converter array. A relatively simple test signal and measurement technique should be used in order to allow automatic calibration of the digital equalizer. Such a measurement technique could be performed upon power-up and at periodic intervals when the system is off-line for short intervals of time. Individual converter effects can be measured by injecting an AC-coupled sine wave into the converter. Samples are then taken and averaged over a long enough time to achieve a sufficient offset resolution. The individual converter gains are measured similarly. Relative frequency/phase response of the individual converters may be determined by injecting a sine wave at the common input and simultaneously measuring the individual converter outputs. The coefficients for the equalization filters will be calculated and saved. Thus, the filters will be updated for any changes amongst the analog-to-digital converters caused by environmental conditions or other causes.

In view of the foregoing, it can be appreciated that the present invention enables the user to achieve a high speed analog-to-digital conversion without the effects from variation in characteristics of individual converters that make up the conversion. Thus, while this invention has been described herein in connection with a particular example thereof, no limitation is intended thereby except as defined by the following claims. This is because modifications can be made without departing from the spirit of this invention after studying the specification and drawings.

What is claimed is:

1. In an analog-to-digital converter circuit having a plurality of time interleaved analog-to-digital converters for receiving an analog input signal and generating a plurality of digital signals, the improvement comprising
equalization means for compensating for individual variations in converter characteristics found amongst the plurality of analog-to-digital converters, said equalization means including:
a reference converter being chosen from one of said analog-to-digital converters, each of the remaining plurality of analog-to-digital converters being referenced to said reference converter;
means for providing a differential response between said reference converter and each of the remaining converters; and
equalization filter means having individual equalization filters coupled to each of said remaining analog-to-digital converters, each filter receiving input signals from each of the plurality of analog-to-digital converters and having filter coefficients which provide compensation for variations in timing and frequency/phase response between said reference converter and each of the remaining converters.

2. The improvement of claim 1 wherein said equalization means further comprises gain equalization means for compensating for variations in gain between said reference converter and each of the remaining converters.

3. The improvement of claim 2 wherein said equalization means further comprises offset equalization means for adjusting for variations in converter offsets found between said reference converter and each of the remaining converters.

4. The improvement of claim 3 wherein said differential responses are transformed to the Z-domain and placed in a matrix of polynomials, said matrix being inverted to generate the coefficients for each of said equalization filters.

5. The improvement of claim 4 wherein the converter characteristics of offset, gain, timing, and frequency/phase response of the plurality of analog-to-digital converters are measured periodically and new equalization filter coefficients are calculated to thereby provide for compensation for differences in the characteristics found amongst the analog-to-digital converters.

6. The improvement of claim 5 wherein the gain and offset equalization means both includes summers and multipliers.

7. The improvement of claim 6 wherein the sampling rate of each analog-to-digital filter is set equal to the sampling rate of the system.

8. The improvement of claim 1 further comprising a low pass filter for filtering out high frequency signals and only allowing lower frequency analog signals to pass through to the analog-to-digital converters.

9. In an analog-to-digital converter circuit having a plurality of time interleaved analog-to-digital converters for receiving an analog input signal and generating a plurality of digital signals, the improvement comprising:
equalization means for compensating for individual variations in converter characteristics found amongst the plurality of analog-to-digital converters, said equalization means including:
a reference converter being chosen from one of said analog-to-digital converters, each of the remaining plurality of analog-to-digital converters being referenced to said reference converter;
means for providing a differential response between said reference converter and each of the remaining converters;
equalization filter means having individual equalization filters coupled to each of said remaining analog to-digital converters, said filter means receiving input signals from each of the plurality of analog-to-digital converters and having filter coefficients which provide compensation for variations in timing and frequency/phase response between said reference converter and each of the remaining converters;
gain equalization means for compensating for variations in gain between said reference converter and each of the remaining converters; and
offset equalization means for adjusting for variations in converter offsets found between said reference converter and each of the remaining converters.

10. The improvement of claim 9 wherein said differential responses are transformed to the Z-domain and placed in a matrix of polynomials, said matrix being inverted to generate the coefficients for each of said equalization filters.

11. The improvement of claim 10 wherein the converter characteristics of offset, gain, timing, and frequency/phase response of the plurality of analog-to-digital converters are measured periodically and new equalization filter coefficients are calculated to thereby provide for compensation for differences in the characteristics found amongst the analog-to-digital converters.

12. The improvement of claim 11 wherein the gain and offset equalization means both includes summers and multipliers.

13. In an analog-to-digital converter circuit having a plurality of time interleaved analog-to-digital converters for receiving an analog input signal and generating a plurality of digital signals, a method for removing converter offsets and relative variations of gain, timing, and frequency/phase response found amongst the plurality of analog-to-digital converters to compensate for differences amongst the plurality of converters, said method comprising;
choosing one of said plurality of analog-to-digital converters as a reference;
comparing each of the remaining plurality of analog-to-digital converters with said reference converter;
subtracting the frequency response and gain of the reference converter from each of the remaining plurality of analog-to-digital converters to obtain differential response of gain, timing, and phase/frequency response; and
equalizing said differential responses to thereby compensate for variations amongst the plurality of converters.

14. The method as defined in claim 13, wherein said method of equalizing further comprises:
transforming the differential responses of phase/frequency and timing to the z domain; and
solving the inverse z transform to generate coefficients for equalization filters.

15. The method as defined in claim 14, wherein each equalization filter means includes inputs from each of the plurality of analog-to-digital converters.

16. An analog-to-digital converter circuit for receiving an analog input signal and generating a plurality of digital signals, said circuit comprising:
- a plurality of time interleaved analog-to-digital converters;
- one of said analog-to-digital converters being chosen as a reference converter;
- each of the remaining plurality of analog-to-digital converters being referenced to said reference converter; and
- equalization means for providing compensation for individual variations of gain, timing, frequency/phase response and converter offsets found amongst the plurality of analog-to-digital converters, said equalization means including equalization filter means coupled to each of said remaining analog-to-digital converters, said filter means receiving input signals from each of the plurality of analog-to-digital converters and having filter coefficients which provides for compensation for said individual converter variations of timing and frequency/phase response.

17. The converter circuit as defined in claim 16 further comprises means for obtaining differential response between said reference converter and each of the remaining converters, said differential responses being transformed to the Z-domain and placed in a matrix of polynomials, said matrix being inverted to generate said filter coefficients for each of the equalization filters.

* * * * *